United States Patent [19]

Meuller

[11] Patent Number: 4,843,306
[45] Date of Patent: Jun. 27, 1989

[54] REPLACEABLE RESISTORS FOR CALIBRATING A WATTHOUR METER

[75] Inventor: Markus E. Meuller, Zug, Switzerland

[73] Assignee: Landis & Gyr Metering, Inc., Lafayette, Ind.

[21] Appl. No.: 99,258

[22] Filed: Sep. 21, 1987

[51] Int. Cl.$^4$ ............................................. G01R 11/17
[52] U.S. Cl. ...................................... 324/74; 324/115; 324/142; 364/571.01
[58] Field of Search ................. 324/74, 115, 116, 142; 364/571

[56] References Cited

U.S. PATENT DOCUMENTS

| | | |
|---|---|---|
| 134,636 | 1/1873 | Bradley . |
| 796,039 | 8/1905 | Duncan ............................. 324/116 |
| 2,189,660 | 2/1940 | Boudreau . |
| 2,205,309 | 6/1940 | Riordan . |
| 2,472,013 | 5/1949 | Hansell . |
| 3,355,659 | 11/1967 | Burgess . |
| 3,390,327 | 6/1968 | Bosworth et al. ..................... 324/74 |
| 3,609,543 | 9/1971 | Whitmore . |
| 3,711,774 | 1/1973 | Bohler . |
| 4,157,501 | 6/1979 | Cain, Jr. et al. .................... 324/115 |
| 4,314,201 | 2/1982 | Marro et al. . |
| 4,335,349 | 6/1982 | Baldock et al. ....................... 324/74 |
| 4,337,517 | 6/1982 | Nickel et al. ........................ 364/571 |
| 4,634,971 | 1/1987 | Johnson et al. . |
| 4,659,985 | 4/1987 | Bianchi ............................... 324/116 |
| 4,688,194 | 8/1987 | Shimizu .............................. 364/571 |

*Primary Examiner*—Reinhard J. Eisenzopf
*Assistant Examiner*—W. Burns
*Attorney, Agent, or Firm*—Woodard, Emhardt, Naughton, Moriarty & McNett

[57] ABSTRACT

A solid-state watthour meter for registering AC electrical energy consumption by a load connected to a source of AC load current and AC line voltage includes a voltage sensing transducer for producing a signal corresponding to the line voltage and a current sensing transducer for producing a signal corresponding to the load current. A solid-state measurement circuit receives the voltage and current signals as its inputs and produces an output signal corresponding to the AC electrical energy consumption of the load. A power supply, including a regulator circuit having a calibration resistor, provides a DC voltage to the measurement circuit. The DC voltage across the regulator circuit is dependent on the impedance of the calibration resistor. The measurement circuit includes apparatus for relating the registration of the meter to the DC supply voltage. The calibration resistor is readily removably electrically connected in the regulator circuit. Replacement of the calibration resistor causes a change in the supply voltage to the measurement circuit which, in turn, causes a change in the registration of the watthour meter.

5 Claims, 3 Drawing Sheets

REPLACEABLE RESISTORS FOR CALIBRATING A WATTHOUR METER

BACKGROUND OF THE INVENTION

This invention relates to the field of solid state watthour meters, and more particularly to the calibration of the registration of these meters.

In solid state watthour meters, the registration of the meter is indicative of the product of the meter reading and the watthour constant, corresponding to the energy measurement of the meter. Percent registration is the ratio of the actual registration of the meter to the true value of the quantity measured in a given time, expressed as a percentage. Percent error is the difference between its percent registration and one hundred percent. A low percent error registration is important to ensure accurate measurement of the AC electrical energy consumed by a customer and proper calculation of the charge for the electrical service.

In many prior art meters, changes in registration are accomplished by altering the rotational rate of the meter disk. In solid state watthour meters, calibration has been achieved using a potentiometer to, in essence, vary the watthour constant for the meter. However, potentiometers are typically expensive and susceptible to reliability and stability problems.

In view of these difficulties, it is an object of the present invention to provide means for calibrating the registration of a watthour meter that is inexpensive, yet reliable. Another object is to provide a means for calibration that is stable, particularly in the harsh temperature environment of the watthour meter. An additional object is to provide a means for registration that is readily and easily accessible for the meter technician or customer. Other objects and benefits of the present invention will be observed in the following disclosure and accompanying figures.

SUMMARY OF THE INVENTION

A solid-state watthour meter for registering AC electrical energy consumption by a load connected to a source of AC load current and AC line voltage includes a voltage sensing transducer for producing a signal corresponding to the line voltage and a current sensing transducer for producing a signal corresponding to the load current. A solid-state measurement circuit receives the voltage and current signals as its inputs and produces an output signal corresponding to the AC electrical energy consumption of the load. A power supply, including a regulator circuit having a calibration resistor, provides a DC voltage to the measurement circuit. The DC voltage across the regulator circuit is dependent on the impedance of the calibration resistor. The measurement circuit includes means for relating the registration of the meter to the DC supply voltage. The calibration resistor is readily removably electrically connected in the regulator circuit. Replacement of the calibration resistor causes a change in the supply voltage to the measurement circuit which, in turn, causes a change in the registration of the watthour meter.

DESCRIPTION OF THE PREFERRED EMBODIMENT

Figure 1:
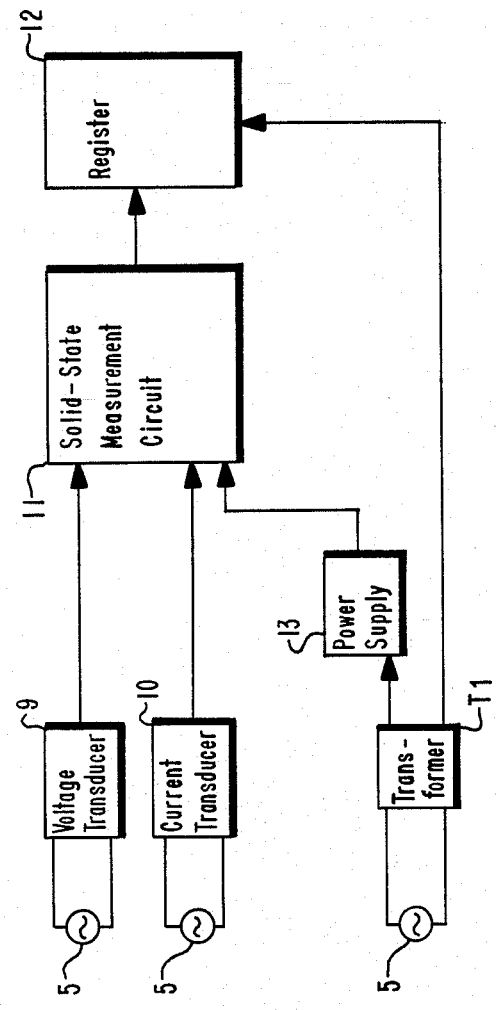
FIG. 1 is a block diagram of the watthour meter of the present invention.

For the purposes of promoting an understanding of the principles of the invention, reference will now be made to the embodiment illustrated in the drawings and specific language will be used to describe the same. It will nevertheless be understood that no limitation of the scope of the invention is thereby intended, such alterations and further modifications in the illustrated device, and such further applications of the principles of the invention as illustrated therein being contemplated as would normally occur to one skilled in the art to which the invention relates.

In practicing the present invention, the electrical system in which AC energy consumption is being measured may be of any type including, for example, a conventional 60 Hz power distribution system. Further, the system can be a single phase or a polyphase system. In the preferred embodiment of the invention, the watthour meter is capable of measuring power consumption in a three-phase Wye or Delta configured system. Referring to the block diagram of FIG. 1, the present watthour meter includes a voltage transducer 9 and a current transducer 10 which are electrically connected across an AC source 5. Line voltage and load currents drawn by the load are reduced to a usable level by voltage transducer 9 and current transducer 10, respectively. This may be accomplished by separate circuitry for each phase. The resulting signals are applied to a solid-state measurement circuit 11. The measurement circuit 11 may include a number of oscillator and modulator networks for calculating and summing the power in each phase. Output signals are conveyed from measurement circuit 11 to register 12 which represent the energy consumed by the load. The output signals from measurement circuit 11 are a function of the registration of the watthour meter. Register 12 records and displays the amount of energy delivered to the load across which the metering unit is connected. A power supply network 13 provides regulated power to the measurement circuit 11 and the register 12 from a potential transformer T1, which derives its power from AC source 5. The registration of the meter is a function of the supply voltage to the measurement circuit 11.

Figure 2:
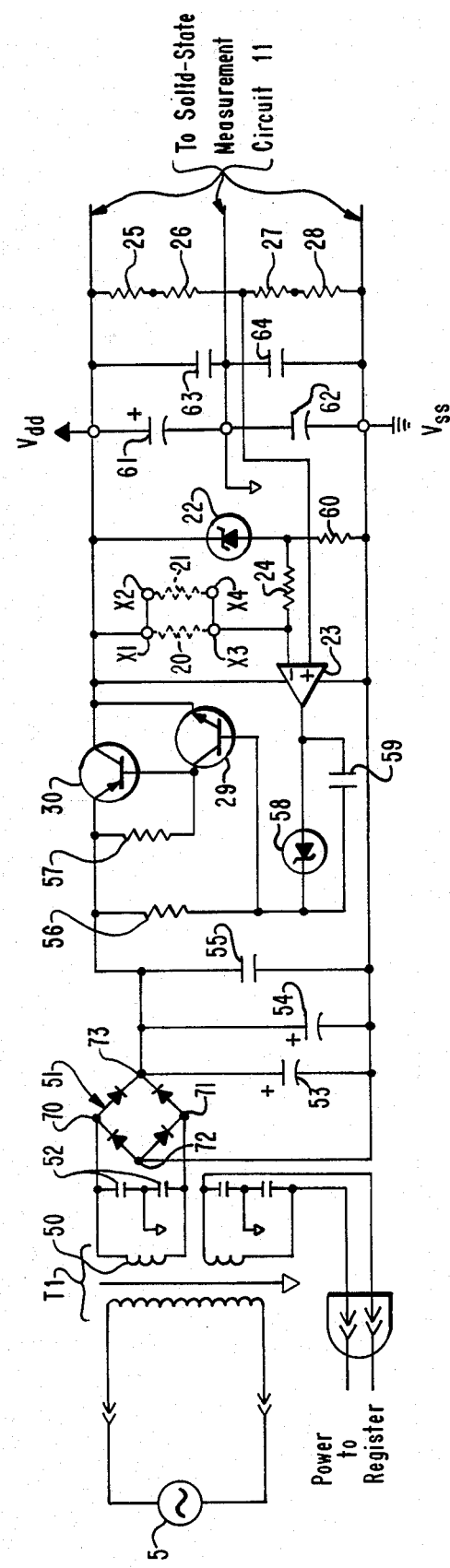
FIG. 2 is a schematic diagram of the power supply for the watthour meter shown in FIG. 1.

Referring now to FIG. 2, there is shown a registration circuit which provides DC voltage to the solid-state measurement circuit 11 described above. The potential of the AC source 5 is reduced at the secondary coil 50 of the potential transformer T1. The ends of the secondary coil 50 are connected across a pair of terminals 70 and 71 of a full wave rectifier 51, which is in the form of a conventional diode bridge rectifier. Between secondary coil 50 and rectifier 51 are a series pair of overvoltage protection capacitors 52, which are connected in parallel with the secondary windings 50. Parallel capacitors 53, 54, and 55 are connected across rectifier terminals 72 and 73. Rectifier 51 and capacitors 53, 54, and 55 convert the AC signal supplied by transformer T1 to a DC signal usable by the measurement circuit 11.

An amplifier network includes transistor 30 coupled at its collector to terminal 73 of rectifier 51. Resistor 57 connects from terminal 73 to the base of transistor 30 and the collector of transistor 29. The base of transistor 29 is coupled to terminal 73 across resistor 56. The amplifier network is connected to the output of an operational amplifier 23 through a parallel network comprising a capacitor 59 and a zener diode 58. In the preferred embodiment, diode 58 is of the type 1N750A, 4.7V. The op-amp 23 is driven by the difference in the negative line voltage at terminal 72 of rectifier 51, referred to as $V_{ss}$, and the potential at the emitter of transistor 29, referred to as $V_{dd}$. This difference ($V_{ss}$-$V_{dd}$) is the supply voltage to measurement circuit 11.

A series of resistors 25, 26, 27, and 28 are connected between the potentials $V_{dd}$ and $V_{ss}$. The non-inverting input of op-amp 23 is connected at the junction between resistors 26 and 27. Potential $V_{dd}$ is applied to the inverting input of op-amp 23 through a network of parallel resistors 20 and 21. Also connected to the inverting input of op-amp 23 is a resistor 24. A zener diode 22 is connected between resistor 24 and $V_{dd}$. In the preferred embodiment, diode 22 is of the type LM129, 6.9V. A resistor 60 is coupled between resistor 24 and $V_{ss}$. In parallel connection with resistor network 25, 26, 27, and 28 is a pair of capacitors 61 and 62, and a pair of capacitors 63 and 64.

The value of the supply voltage and, correspondingly, the registration of the meter, can be changed by varying the value of either one or both of resistors 20 and 21. In the preferred embodiment of the present invention, resistor 20 is considered the coarse calibration resistor and resistor 21 the fine calibration resistor. For the present watthour meter, the relationship between the value of resistor 20 and 21 and the meter registration is determined by the following proportionality:

$$\text{Registration} = \text{Constant } X \left( 1 + \frac{1000}{R20} + \frac{1000}{R21} \right)^2$$

Thus, changing resistors 20 and 21 selected according to the above equation will increase or decrease the supply voltage to the measurement circuit 11 to achieve a specific registration. The resistors 20 or 21 are preferably Mil Type RN55C, having a resistance tolerance of ±1% and a temperature coefficient of 50 PPM/° C. to ensure long-term stability over the life of the meter. These resistors are normally available from commercial electronics distributors in resistance increments of 2%.

Figure 3:
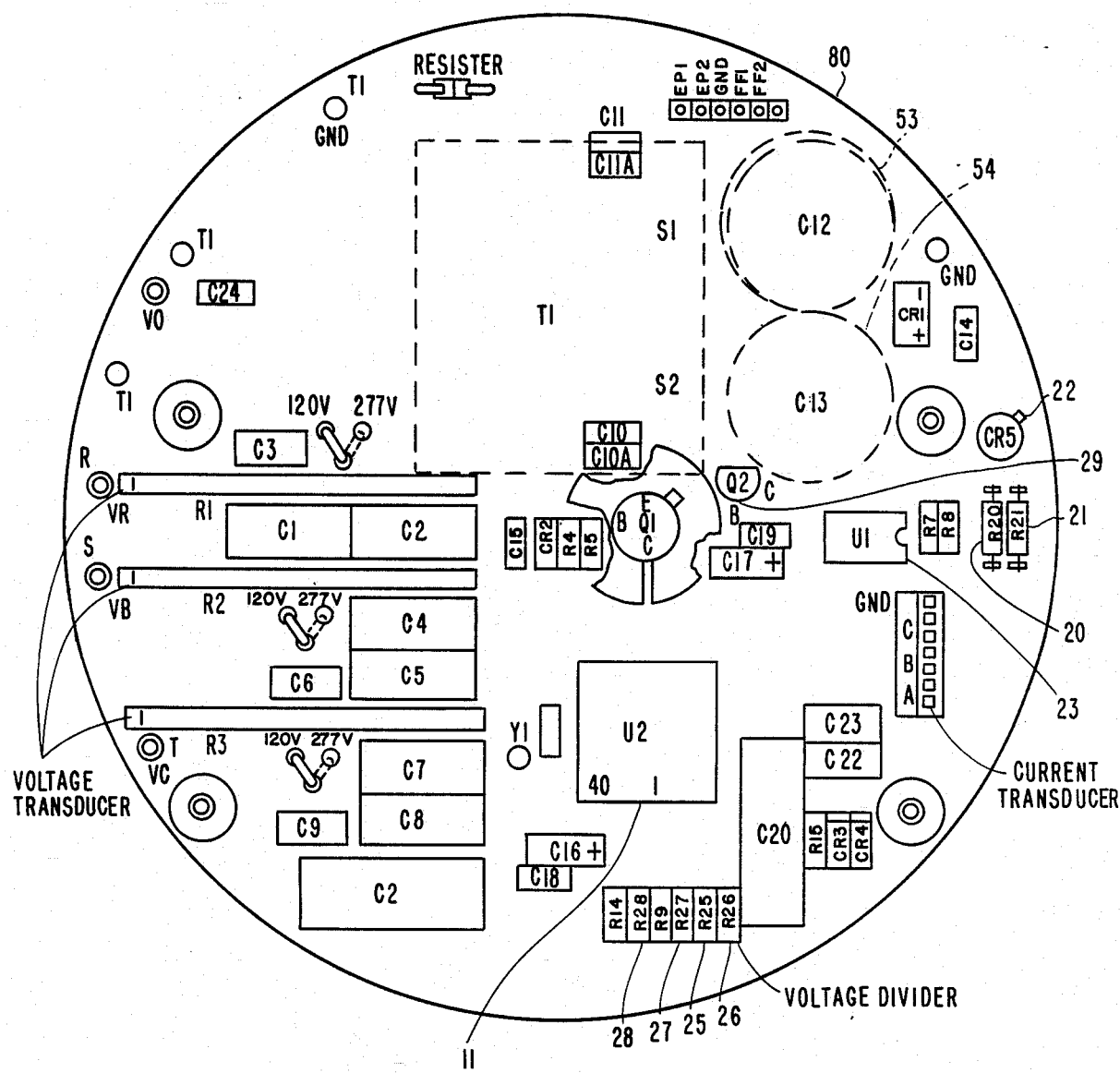
FIG. 3 is a representation of the the measurement board for the watthour meter of the present invention, showing the placement of certain power supply components on the board.
Figure 4:
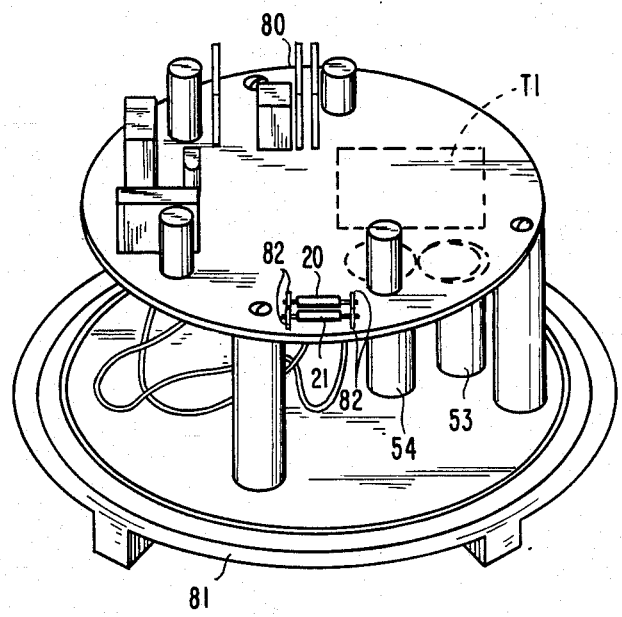
FIG. 4 is a perspective view of the measurement board depicted in FIG. 3, shown mounted to the back housing of the watthour meter.

FIGS. 3 and 4 show the placement of certain components of the watthour meter on a printed circuit board 80. Solid state measurement circuit 11, power supply op-amp 23, transistor 29, diode 22, and resistors 25, 26, 27, and 28 are positioned at the front of the circuit board 80. Potential transformer T1 is mounted on the underside of circuit board 80. In another aspect of the present invention, calibration resistors 20 and 21 are mounted near the edge of circuit board 80 on two pairs of bifurcated posts 82 which are connected to the front side of the circuit board 80. This manner of mounting resistors 20 and 21 makes the resistors readily accessible for easy replacement in the event that the meter registration drifts.

The resistors 20 and 21 are very inexpensive, particularly relative to the potentiometers employed in prior art devices. Moreover, the resistors are more reliable than a potentiometer because there are no moving parts to contend with. The thermal coefficient of the resistors of the preferred embodiment is sufficiently high to ensure long term stability of the resistor impedance, even in the watthour meter thermal environment. Finally, the connection of the resistors using bifurcated posts makes replacement of the resistors easy and reliable.

While the invention has been illustrated and described in detail in the drawings and foregoing description, the same is to be considered as illustrative and not restrictive in character, it being understood that only the preferred embodiment has been shown and described and that all changes and modifications that come within the spirit of the invention are desired to be protected.

What is claimed is:

1. A solid-state watthour meter for registering AC electrical energy consumption by a load connected to a source of AC load current and AC line voltage, comprising:
   voltage sensing means for producing a first signal corresponding to the line voltage;
   current sensing means for producing a second signal corresponding to the load current;
   a solid-state measurement circuit having an input for receiving said first and second signals, an output, and means for producing a third signal at said output corresponding to the AC electrical energy consumption of the load;
   a power supply, including a regulator circuit having a first resistor, for providing a DC voltage to said measurement circuit, said DC voltage being dependent on the impedance of said first resistor, and
   means for calibrating the registration of said meter including means in said measurement circuit for relating the registration of said meter to said DC voltage, and further including means for readily removably electrically connecting said first resistor in said regulator circuit.

2. The solid-state watthour meter of claim 1 wherein said calibrating means further includes a second resistor readily removably electrically connected in said regulator circuit in parallel with said first resistor, said DC voltage being dependent on the impedance of said second resistor, wherein said first and second resistors are sized relative to each other to respectively provide coarse and fine calibration adjustments.

3. The solid-state watthour meter of claim 2 wherein said replaceable resistor has a resistance value tolerance of ±1% and a temperature coefficient of 50 PPM/° C.

4. A method for calibrating the watthour meter of claim 2, comprising the steps of:
   (a) determining the desired meter registration; and
   (b) selecting said first resistor and said second resistor having resistances values which satisfy the following proportionality:

$$\text{Registration} = \text{Constant } X \left( 1 + \frac{1000}{R20} + \frac{1000}{R21} \right)^2$$

wherein R20 is the resistance value of said first resistor and R21 is the resistance value of said second resistor.

5. The solid-state watthour meter of claim 1 wherein said replaceable resistor has a resistance value tolerance of ±1% and a temperature coefficient of 50 PPM/° C.

* * * * *